United States Patent
Goktepeli et al.

(10) Patent No.: US 10,290,579 B2
(45) Date of Patent: May 14, 2019

(54) UTILIZATION OF BACKSIDE SILICIDATION TO FORM DUAL SIDE CONTACTED CAPACITOR

(71) Applicant: QUALCOMM Incorporated, San Diego, CA (US)

(72) Inventors: Sinan Goktepeli, San Diego, CA (US); Plamen Vassilev Kolev, San Diego, CA (US); Michael Andrew Stuber, Rancho Santa Fe, CA (US); Richard Hammond, San Diego, CA (US); Shiqun Gu, San Diego, CA (US); Steve Fanelli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/807,169

(22) Filed: Nov. 8, 2017

(65) Prior Publication Data

US 2018/0076137 A1    Mar. 15, 2018

Related U.S. Application Data

(62) Division of application No. 15/240,952, filed on Aug. 18, 2016, now Pat. No. 9,847,293.

(51) Int. Cl.
| | |
|---|---|
| H01L 21/48 | (2006.01) |
| H01L 23/528 | (2006.01) |
| H01L 23/522 | (2006.01) |
| H01L 23/532 | (2006.01) |
| H01L 23/66 | (2006.01) |
| H01L 27/12 | (2006.01) |

(Continued)

(52) U.S. Cl.
CPC ...... *H01L 23/5283* (2013.01); *H01L 23/5223* (2013.01); *H01L 23/53209* (2013.01); *H01L 23/66* (2013.01); *H01L 27/1203* (2013.01); *H01L 28/40* (2013.01); *H01L 29/0649* (2013.01); *H01L 29/66181* (2013.01); *H01L 29/94* (2013.01); *H04B 1/16* (2013.01); *H01L 2223/6677* (2013.01)

(58) Field of Classification Search
CPC .............. H01L 2924/00; H01L 21/568; H01L 2224/04026; H01L 2224/04105
See application file for complete search history.

(56) References Cited

U.S. PATENT DOCUMENTS

| | | | |
|---|---|---|---|
| 5,736,776 | A | 4/1998 | Yamamoto et al. |
| 6,320,237 | B1 | 11/2001 | Assaderaghi et al. |

(Continued)

OTHER PUBLICATIONS

International Search Report and Written Opinion—PCT/US2017/042213—ISA/EPO—dated Nov. 23, 2017.

(Continued)

*Primary Examiner* — Jaehwan Oh
(74) *Attorney, Agent, or Firm* — Qualcomm Incorporated/Seyfarth Shaw LLP

(57) ABSTRACT

An integrated circuit structure may include a capacitor having a semiconductor layer as a first plate and a gate layer as a second plate. A capacitor dielectric layer may separate the first plate and the second plate. A backside metallization may be coupled to the first plate of the capacitor. A front-side metallization may be coupled to the second plate of the capacitor. The front-side metallization may be arranged distal from the backside metallization.

6 Claims, 9 Drawing Sheets

(51) Int. Cl.
*H01L 49/02* (2006.01)
*H01L 29/06* (2006.01)
*H04B 1/16* (2006.01)
*H01L 29/66* (2006.01)
*H01L 29/94* (2006.01)

(56) References Cited

U.S. PATENT DOCUMENTS

| | | | |
|---|---|---|---|
| 7,064,043 | B1 | 6/2006 | Rouse |
| 7,871,881 | B2 | 1/2011 | Johansson |
| 8,119,474 | B2 | 2/2012 | Bryant et al. |
| 8,969,938 | B2 | 3/2015 | Cheng et al. |
| 9,257,393 | B1 * | 2/2016 | Gong ................. H01L 23/3114 |
| 9,607,918 | B2 * | 3/2017 | Gong ................. H01L 23/3114 |
| 9,620,463 | B2 * | 4/2017 | Kim ..................... H01L 21/568 |
| 9,847,293 | B1 | 12/2017 | Goktepeli et al. |
| 2005/0199933 | A1 | 9/2005 | Yasuda et al. |
| 2005/0280087 | A1 * | 12/2005 | Babcock ............ H01L 23/5223 |
| | | | 257/343 |
| 2006/0170044 | A1 | 8/2006 | Tu |
| 2006/0244061 | A1 | 11/2006 | Nowak et al. |
| 2009/0057742 | A1 | 3/2009 | Lee et al. |
| 2009/0121260 | A1 * | 5/2009 | Bernstein ............ H01L 21/6835 |
| | | | 257/255 |
| 2009/0212391 | A1 * | 8/2009 | Carobolante ......... H01L 23/642 |
| | | | 257/531 |
| 2012/0258594 | A1 * | 10/2012 | Barth ................ H01L 21/76898 |
| | | | 438/667 |
| 2013/0049182 | A1 * | 2/2013 | Gong ................... H01L 21/486 |
| | | | 257/676 |
| 2013/0078753 | A1 * | 3/2013 | Hayes ................ H01L 23/3128 |
| | | | 438/51 |
| 2013/0158378 | A1 * | 6/2013 | Berger ............... A61B 5/14546 |
| | | | 600/348 |
| 2013/0207255 | A1 * | 8/2013 | Magnus .................. H01L 24/96 |
| | | | 257/712 |

OTHER PUBLICATIONS

Partial International Search Report—PCT/US2017/042213—ISA/EPO—dated Sep. 26, 2017.

* cited by examiner

UTILIZATION OF BACKSIDE SILICIDATION TO FORM DUAL SIDE CONTACTED CAPACITOR

CROSS-REFERENCE TO RELATED APPLICATION

This application is a divisional of U.S. patent application Ser. No. 15/240,952, filed on Aug. 18, 2016, entitled "UTILIZATION OF BACKSIDE SILICIDATION TO FORM DUAL SIDE CONTACTED CAPACITOR," the disclosure of which is expressly incorporated by reference herein in its entirety.

TECHNICAL FIELD

The present disclosure generally relates to integrated circuits (ICs). More specifically, the present disclosure relates to a method and apparatus for backside silicidation for forming dual side contacted capacitors.

BACKGROUND

Mobile radio frequency (RF) chip designs (e.g., mobile RF transceivers), including high performance diplexers, have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Passive on glass devices involve high performance inductor and capacitor components that have a variety of advantages over other technologies, such as surface mount technology or multi-layer ceramic chips that are commonly used in the fabrication of mobile radio frequency (RF) chip designs. The design complexity of mobile RF transceivers is complicated by the migration to a deep sub-micron process node due to cost and power consumption considerations. Spacing considerations also affect mobile RF transceiver design deep sub-micron process nodes, such as large capacitors, which may cause a performance bottle-neck during design integration of RF chip designs. For example, metal oxide semiconductor (MOS) capacitors may be used in RF applications to provide an increased capacitance density. Unfortunately, MOS capacitors that are used in advanced complementary MOS (CMOS) processing may occupy a large area to achieve a specified capacitance density.

SUMMARY

An integrated circuit structure may include a capacitor having a semiconductor layer as a first plate and a gate layer as a second plate. A capacitor dielectric layer may separate the first plate and the second plate. A backside metallization may be coupled to the first plate of the capacitor, and a front-side metallization may be coupled to the second plate of the capacitor. The front-side metallization may be arranged distal from the backside metallization.

A method of constructing an integrated circuit structure may include fabricating a device supported by an isolation layer and disposed on a sacrificial substrate. The method may further include depositing a front-side contact layer on a gate layer of the device. A front-side metallization in a front-side dielectric layer may be fabricated on the device and coupled to the front-side contact layer. A handle substrate may be bonded to the front-side dielectric layer on the device. The method may further include removing the sacrificial substrate. A backside contact layer may be deposited on a semiconductor layer of the device. A backside metallization may be fabricated in a backside dielectric layer supporting the isolation layer. The backside metallization may be coupled to the backside contact layer and may be arranged distal from the front-side metallization.

An integrated circuit structure may include a means for storing charge. The means for storing charge may be supported by an isolation layer and a backside dielectric layer. A backside metallization may be arranged in the backside dielectric layer and may be coupled to the charge storing means. A front-side metallization may be arranged in a front-side dielectric layer on the charge storing means. The front-side metallization may be coupled to the charge storing means. The front-side metallization may be arranged distal from the backside metallization.

A radio frequency (RF) front end module may include an integrated radio frequency (RF) circuit structure having a capacitor including a semiconductor layer as a first plate and a gate layer as a second plate. The first plate and the second plate may be separated by a capacitor dielectric layer. A backside metallization may be coupled to the first plate of the capacitor, and a front-side metallization may be coupled to the second plate of the capacitor. The front-side metallization may be arranged distal from the backside metallization. A switch transistor may be coupled to the capacitor. An antenna may be coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
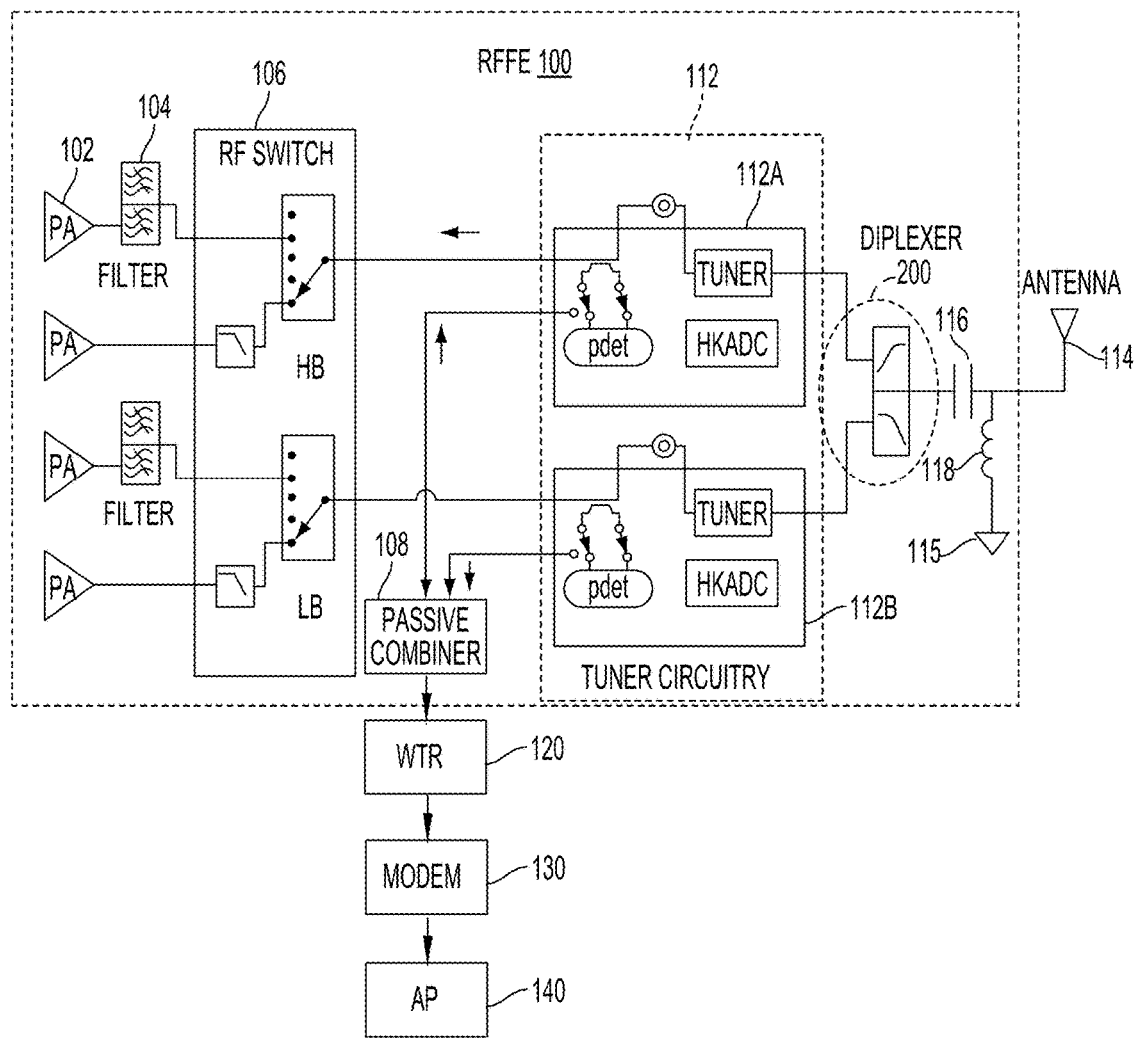
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. In particular, the formation of passive devices during semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of a device on the silicon layer and a substrate supporting the BOX layer. In addition, thinning of a body within SOI-based devices results in a body resistance that has become a major limiting factor in SOI-based capacitors.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material. Metal oxide semiconductor capacitors (MOS) capacitors are one example of a parallel plate capacitor, in which the insulator is a gate oxide, and the plates are made of a body and a gate of a device.

MOS capacitors may be used in RF applications to provide an increased capacitance density. Unfortunately, MOS capacitors used in advanced complementary MOS (CMOS) processing may occupy a large area. Moreover, the thinning of the body in SOI devices yields a substantial body resistance that has become a limiting factor in MOS capacitor performance. As a result, instead of one large area capacitor, many small area capacitors are used to provide a desired capacitance density. This results in inefficient use of chip space, increased chip complexity, and lower chip performance.

Various aspects of the disclosure provide techniques for backside silicidation for forming dual side contacted capacitors in integrated RF circuit structures. The process flow for semiconductor fabrication of the integrated RF circuit structure may include front-end-of-line (FEOL) processes, middle-of-line (MOL) processes, and back-end-of-line (BEOL) processes. The front-end-of-line processes may include the set of process steps that form the devices, such as transistors, capacitors, diodes. The FEOL processes include ion implantation, anneals, oxidation, chemical vapor deposition (CVD) or atomic layer deposition (ALD), etching, chemical mechanical polishing (CMP), epitaxy. The middle-of-line processes may include the set of process steps that enable connection of the transistors to BEOL interconnects. These steps include silicidation and contact formation as well as stress introduction. The back-end-of-line processes may include the set of process steps that form the interconnects that tie the independent transistors and form circuits. Currently, copper and aluminum provide the interconnects, but with further development of the technology other conductive material may be used.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe a post layer-transfer metallization for forming a dual side contacted capacitor (e.g., a MOS capacitor). The post transfer metallization process may form a backside metallization coupled to a first plate of the capacitor. In addition, a front-side metallization distal from the backside metallization may be coupled to a second plate of the capacitor. In this arrangement, the dual side contacted capacitor may provide a desired capacitance density by using a single capacitor without having to perform conventional capacitor subdivision to achieve a desired capacitance density.

One goal driving the wireless communication industry is providing consumers with increased bandwidth. The use of carrier aggregation in current generation communications provides one possible solution for achieving this goal. Carrier aggregation enables a wireless carrier, having licenses to two frequency bands (e.g., 700 MHz and 2 GHz) in a particular geographic area, to maximize bandwidth by simultaneously using both frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
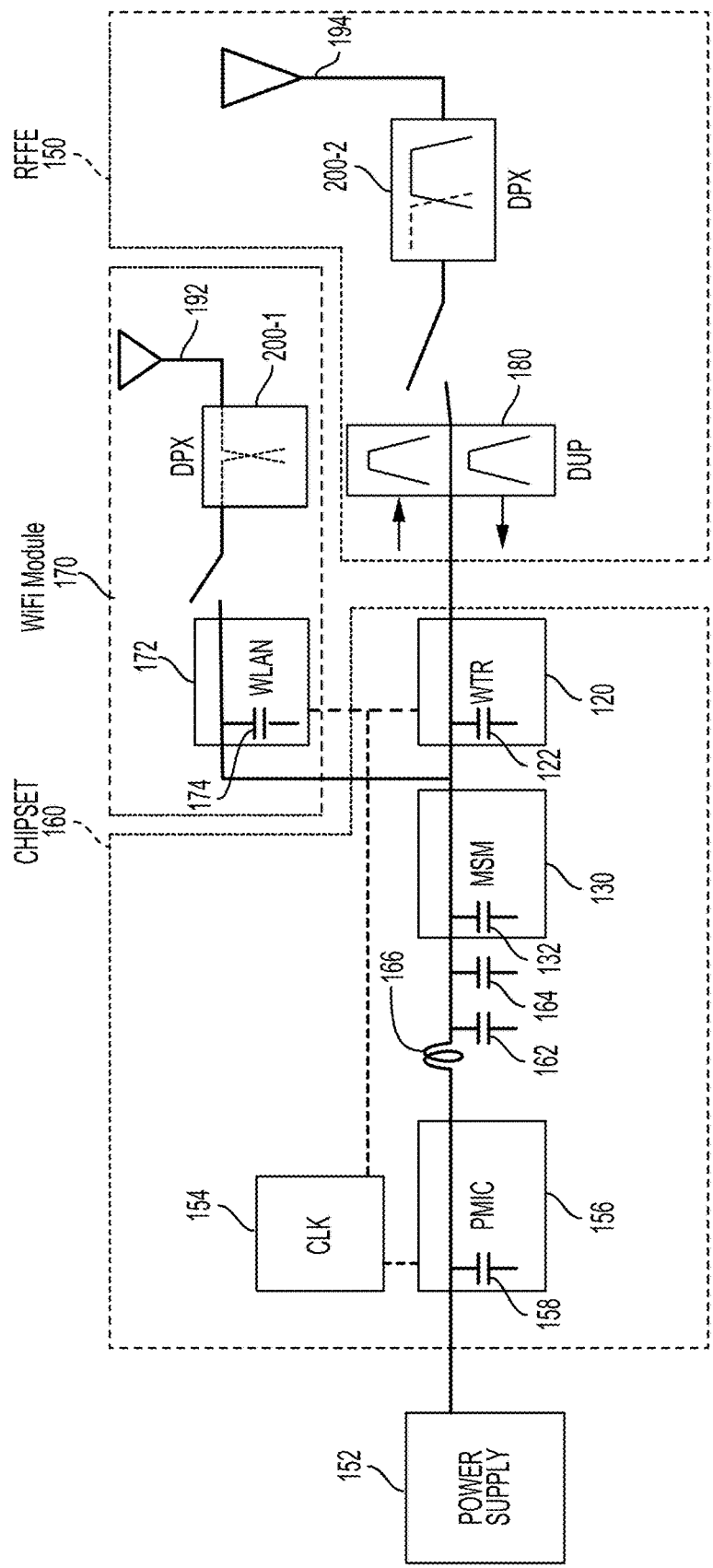
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
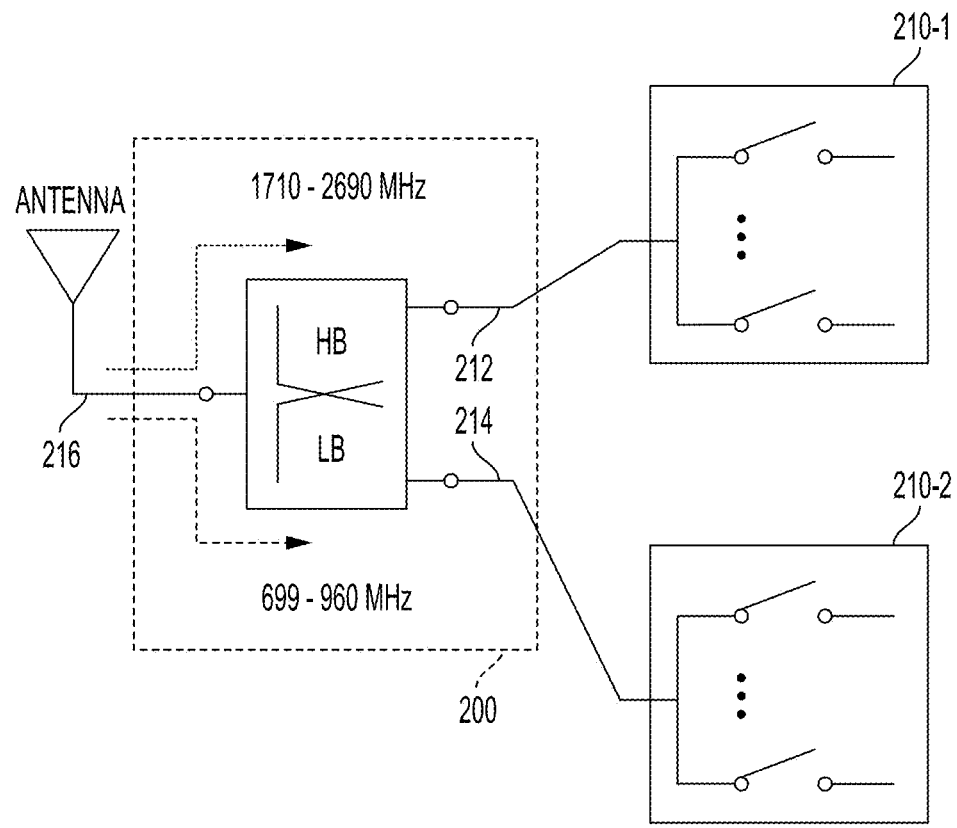
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
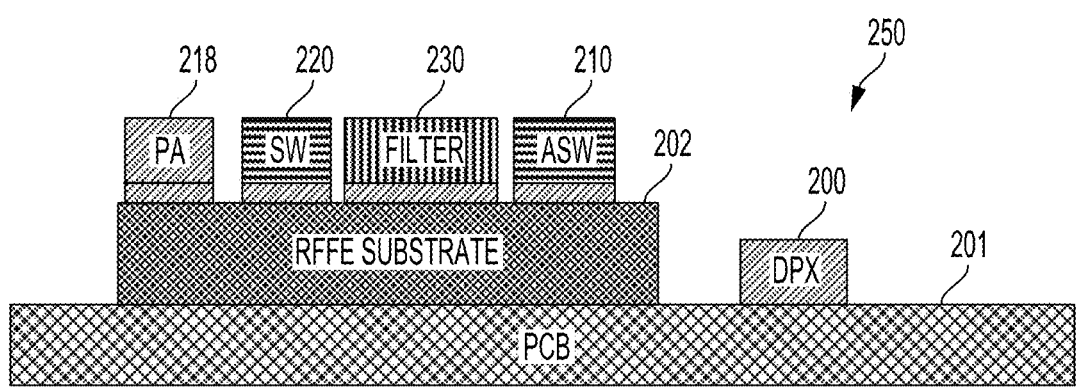
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this arrangement, the RF front end module 250 is implemented using silicon on insulator (SOI) technology that includes capacitors, such as MOS capacitors. Unfortunately, the use of MOS capacitors in advanced complementary MOS (CMOS) processing results in the consumption of a large area to provide a specified capacitance density. Moreover, due to the thinning of the body in SOI devices, the body resistance is a limiting factor in MOS capacitor performance, in which the body is operated as one of the MOS capacitor plates. As a result, instead of one large area capacitor, many small area capacitors are used to provide a desired capacitance density. This results in inefficient use of chip space, increased chip complexity, and lower chip performance. As a result, aspects of the present disclosure include a layer transfer process to form a dual side contacted capacitor (e.g., a MOS capacitor), as shown in FIGS. 3A-3E and 4.

Figure 3A:
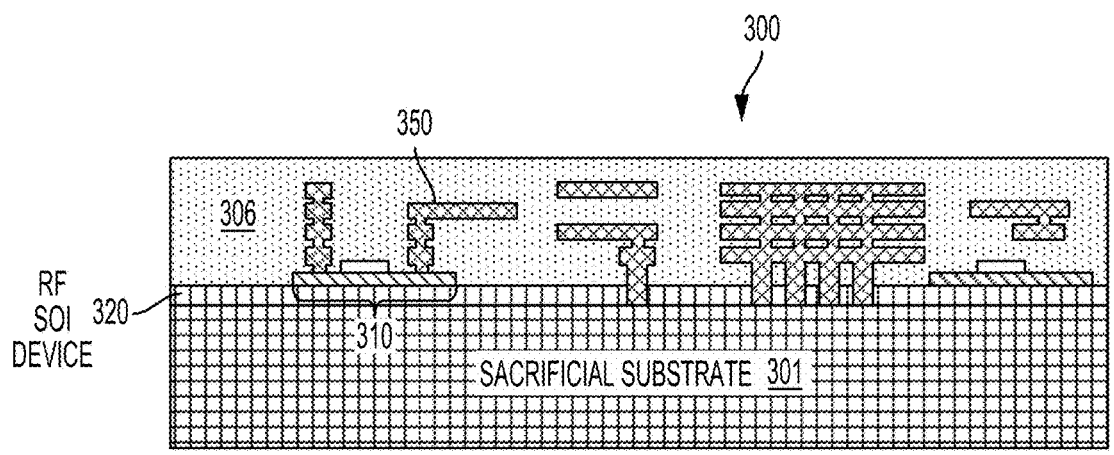
FIGS. 3A to 3E show cross-sectional views of an integrated radio frequency (RF) circuit structure during a layer transfer process according to aspects of the present disclosure.
Figure 3B:
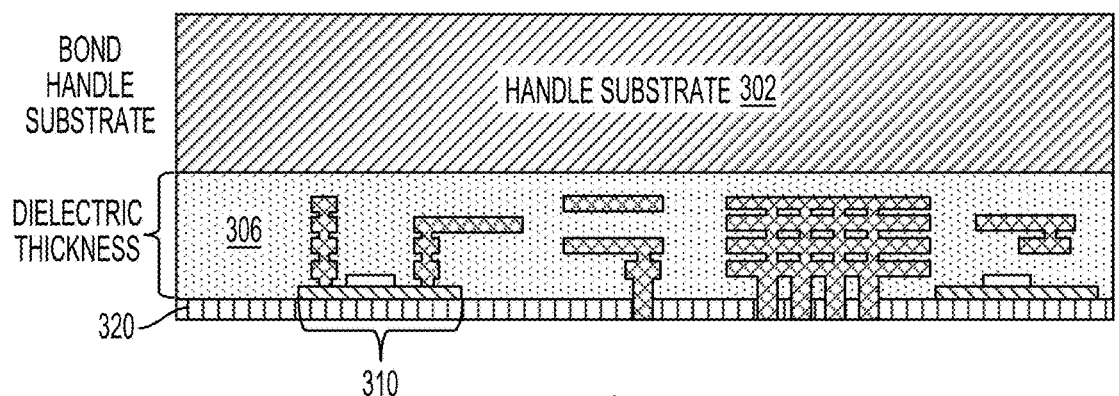

FIGS. 3A to 3E show cross-sectional views of an integrated radio frequency (RF) circuit structure 300 during a layer transfer process according to aspects of the present disclosure. As shown in FIG. 3A, an RF silicon on insulator (SOI) device includes a device 310 on a buried oxide (BOX) layer 320 supported by a sacrificial substrate 301 (e.g., a bulk wafer). The RF SOI device also includes interconnects 350 coupled to the device 310 within a first dielectric layer 306. As shown in FIG. 3B, a handle substrate 302 is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the device 310 and the handle substrate 302.

Figure 3C:
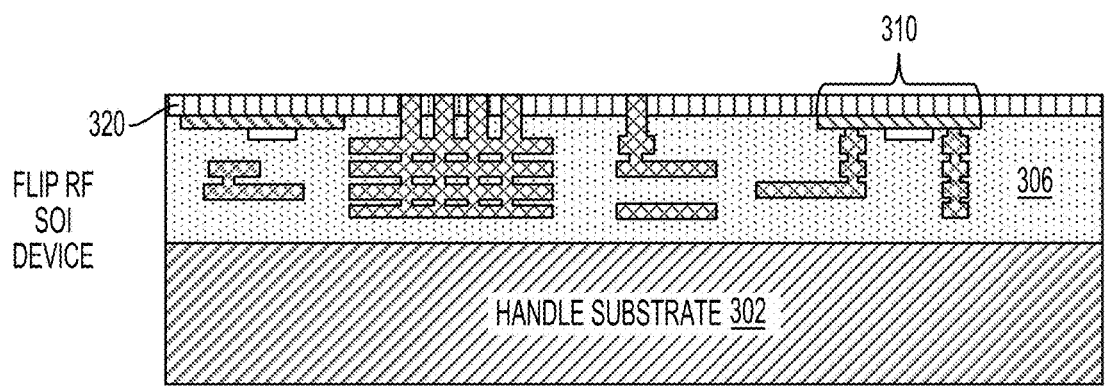
Figure 3D:
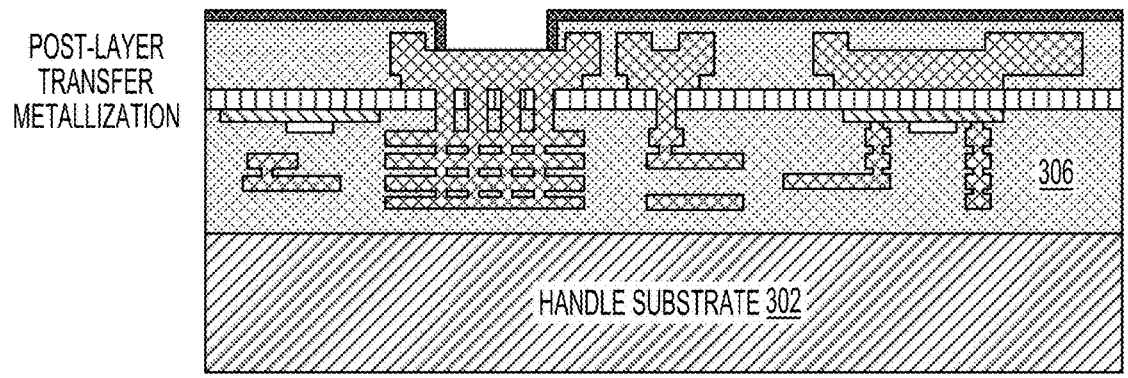
Figure 3E:
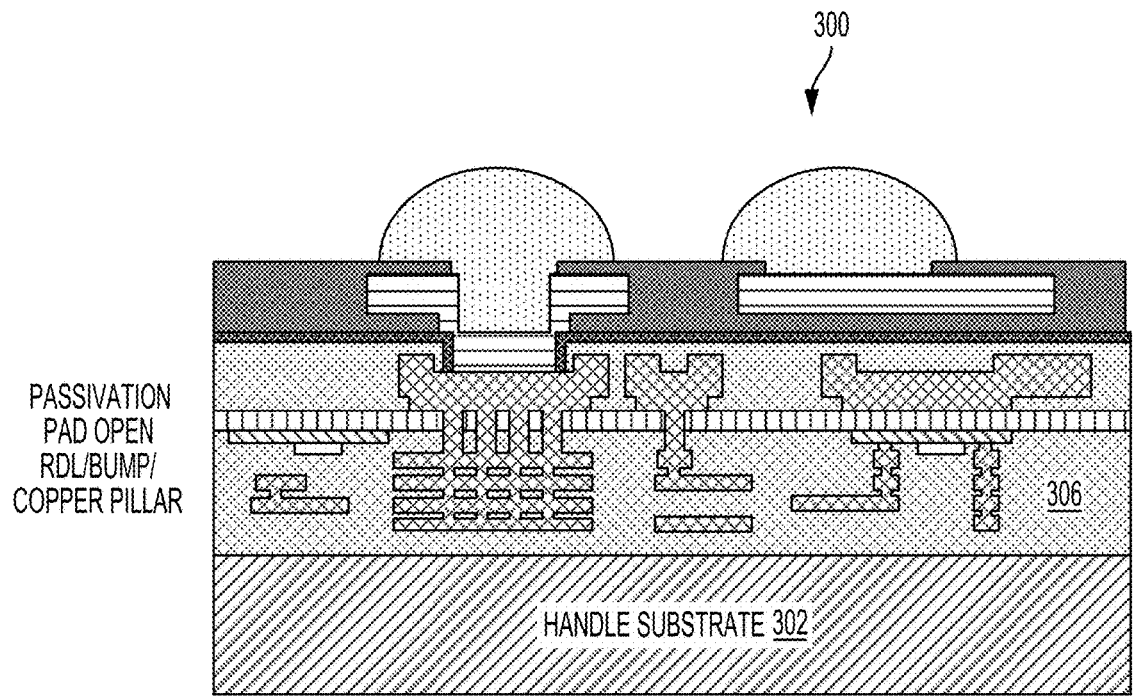

As shown in FIG. 3C, the RF SOI device is flipped once the handle substrate 302 is secured and the sacrificial substrate 301 is removed. As shown in FIG. 3D, a post layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Various aspects of the disclosure provide techniques for layer transfer and post transfer metallization to provide access to a backside of devices of an integrated radio frequency (RF) integrated structure. By contrast, access to devices, formed during a front-end-of line (FEOL) process, is conventionally provided during a middle-end-of-line (MEOL) processing that provides contacts between the gates and source/drain regions of the devices and back-end-of-line (BEOL) interconnect layers (e.g., M1, M2, etc.). Aspects of the present disclosure involve a post layer transfer metallization process for forming a dual side contacted capacitor (e.g., a MOS capacitor) for high quality (Q)-factor RF applications.

Figure 4:
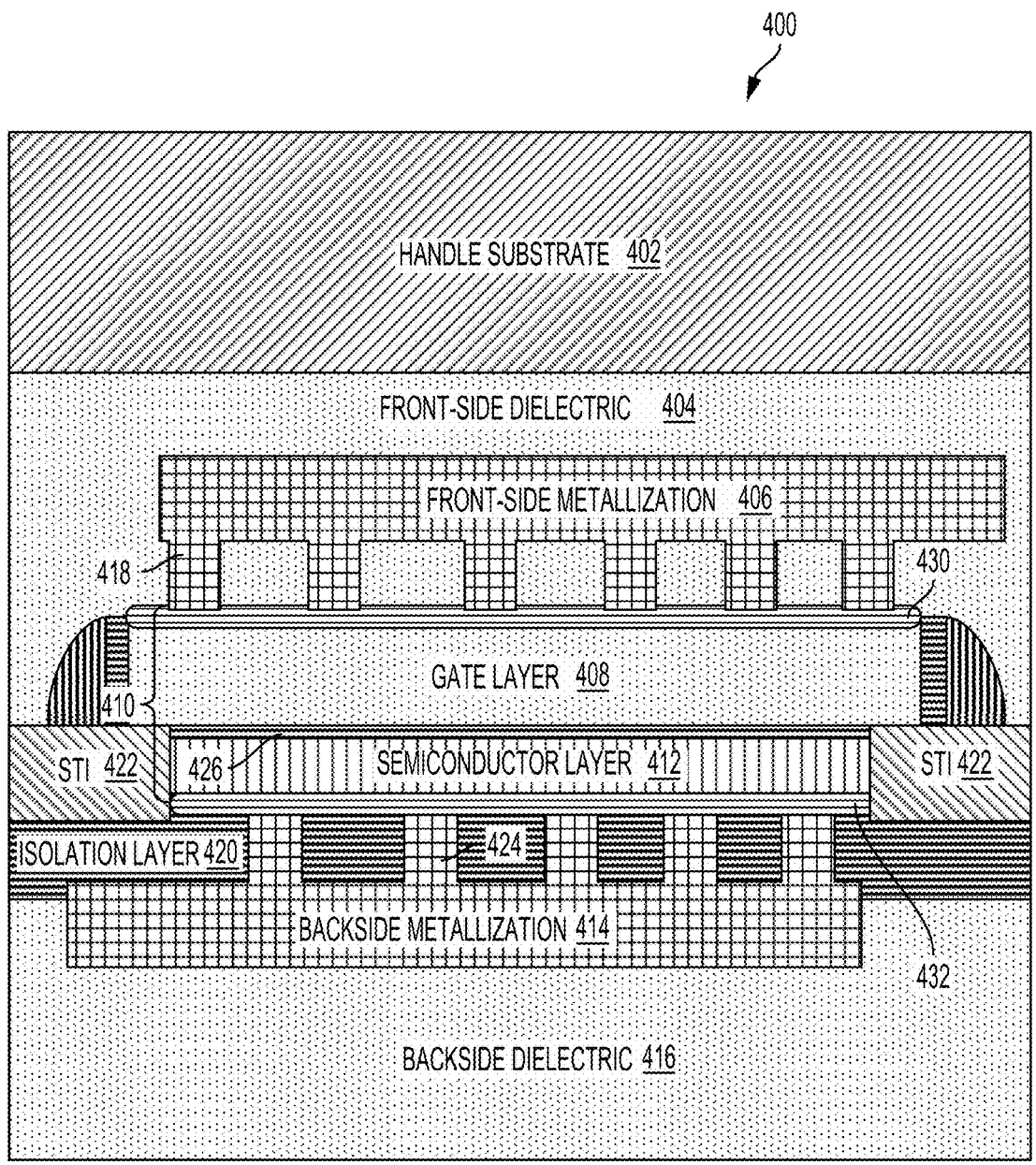
FIG. 4 is a cross-sectional view of an integrated circuit structure including a dual side contacted capacitor fabricated using a layer transfer process according to aspects of the present disclosure.

FIG. 4 is a cross-sectional view of an integrated RF circuit structure 400 including a dual side contacted capacitor fabricated using a layer transfer process according to aspects of the present disclosure. Representatively, the integrated RF circuit structure 400 includes a passive device 410 (e.g., a MOS capacitor) having a semiconductor layer 412 (e.g., a silicon on insulator (SOI)) layer as a first plate and a gate layer 408 (e.g., a poly layer) as a second plate. In this arrangement, the first plate (e.g., the semiconductor layer 412) and the second plate (e.g., the gate layer 408) are separated by a capacitor dielectric layer 426 (e.g., a high-K dielectric) to form the passive device 410. The semiconductor layer 412, the gate layer 408, and the capacitor dielectric layer 426 may all be formed on an isolation layer 420. In SOI implementations, the isolation layer 420 is a buried oxide (BOX) layer, and the SOI layer may include shallow trench isolation (STI) regions 422 supported by the BOX layer (e.g., the isolation layer 420).

As described herein, MOL/BEOL layers are referred to as front-side layers. By contrast, the layers supporting the isolation layer 420 may be referred to herein as backside layers. According to this nomenclature, the integrated RF circuit structure 400 also includes front-side metallization 406 including front-side metallization plugs 418 (e.g., front-side tungsten plugs) coupled together by a front-side metallization layer. The front-side metallization 406 may be coupled to the gate layer 408 through a front-side contact layer 430 (e.g., a front-side silicide layer). In this arrangement, the front-side metallization plugs 418 are coupled to the front-side contact layer 430.

As shown in FIG. 4, a backside metallization 414 is coupled to the semiconductor layer 412 through a backside contact layer 432 (e.g., a backside silicide layer). The backside silicide reduces issues resulting from high resistivity. In this arrangement, the backside metallization 414 includes backside metallization plugs 424 (e.g., backside tungsten plugs) coupled together by a backside metallization layer (e.g., tungsten). The front-side metallization 406 and the backside metallization 414 may be arranged distal and directly opposite from each other. The front-side contact layer and the backside contact layer may be deposited on the gate layer 408 and the semiconductor layer 412, respectively, through front-side silicidation and backside silicidation. In this arrangement, the backside metallization plugs 424 are coupled to the backside contact layer 432 and are joined together by a backside metallization material.

In related aspects of the present disclosure, the front-side metallization 406 may be arranged in a front-side dielectric layer 404 and proximate to the gate layer 408 of the passive device 410. In addition, the backside metallization 414 may be a post-layer transfer metallization layer arranged in a backside dielectric layer 416. In this arrangement, the backside dielectric layer 416 is adjacent to and possibly supports the isolation layer 420. In addition, a handle substrate 402 may be coupled to the front-side dielectric layer 404. An optional trap rich layer may be provided between the front-side dielectric layer 404 and the handle substrate 402. The handle substrate 402 may be composed of a semiconductor material, such as silicon. In one aspect of the present disclosure, the handle substrate includes at least one other active/passive device, such as a switch transistor.

As shown in FIG. 4, aspects of the present disclosure describe a post layer-transfer metallization for forming a dual side contacted capacitor (e.g., a MOS capacitor), which is shown as the passive device 410. The post transfer metallization process may form the backside metallization coupled to a first plate (e.g., the semiconductor layer 412) of the dual side contacted capacitor. In addition, a front-side metallization 406 distal from the backside metallization 414 may be coupled to a second plate (e.g., the gate layer 408) of the dual side contacted capacitor. In this arrangement, the dual side contacted capacitor may provide a desired capacitance density by using a single capacitor without having to perform conventional capacitor subdivision to achieve a desired capacitance density.

Figure 5:
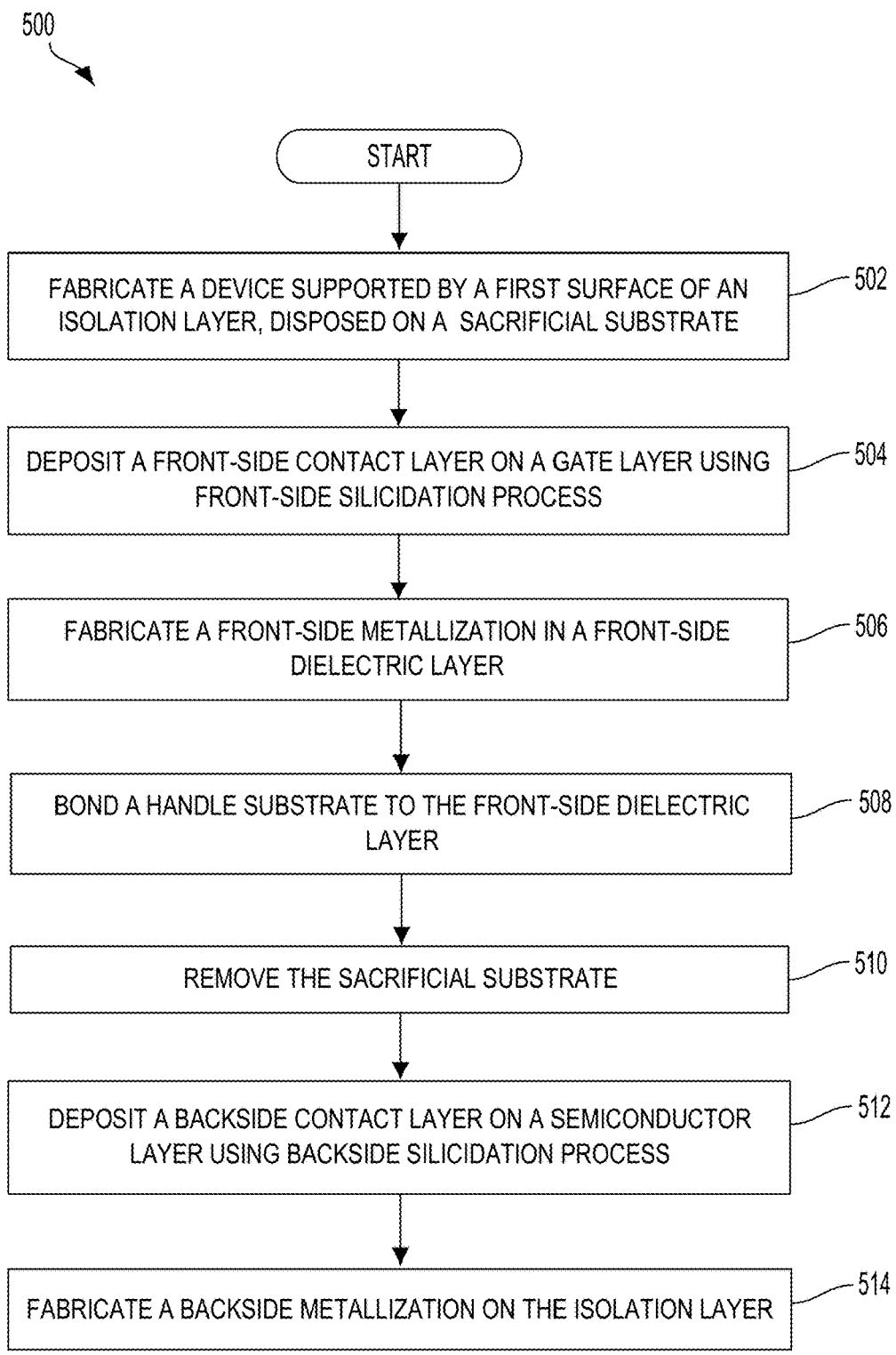
FIG. 5 is a process flow diagram illustrating a method of constructing an integrated circuit structure including a dual side contacted capacitor according to aspects of the present disclosure.

FIG. 5 is a process flow diagram illustrating a method 500 of constructing an integrated radio frequency (RF) circuit structure according to an aspect of the present disclosure. In block 502, a passive device (e.g., a MOS capacitor) is fabricated on a first surface of an isolation layer that is disposed on a sacrificial substrate. For example, as shown in FIG. 3A, a device 310 is fabricated on a buried oxide (BOX) layer. In the arrangement shown in FIG. 4, the passive device 410 (e.g., MOS capacitor) is arranged on a first surface of an isolation layer 420. In one aspect of the present disclosure, a predetermined size diffusion region is formed within the semiconductor layer 412 to provide a first MOS capacitor plate. The size of the diffusion region within the semiconductor layer 412 is determined according to a desired capacitance density. The capacitor dielectric layer 426 is then deposited on the semiconductor layer 412. Next, a gate layer 408 (e.g., a polysilicon layer or metal gate layer) is deposited on the capacitor dielectric layer 426 to complete formation of the MOS capacitor (e.g., the passive device 410).

In block 504, a front-side silicidation process is performed to deposit a front-side contact layer composed of silicide on a surface of a gate layer of the device. For example, as shown in FIG. 4, the front-side contact layer 430 is deposited on the gate layer 408. In block 506, a front-side metallization is fabricated in a front-side dielectric layer on the device. For example, as shown in FIG. 4, the front-side metallization 406 is fabricated in the front-side dielectric layer 404 and is coupled to the passive device 410. The front-side metallization 406 may be coupled to the passive device 410 through the front-side contact layer 430. The front-side metallization 406 may include the front-side metallization plugs 418 (e.g., front-side tungsten plugs) coupled to the front-side contact layer 430 and joined together by depositing a front-side metallization material in a patterned front-side dielectric layer. During fabrication of the front-side metallization 406, the front-side dielectric layer 404 is patterned and etched to expose predetermined portions of the front-side contact layer 430. Once exposed, a first front-side metallization material is deposited on the exposed, predetermined portions of the front-side contact layer 430. Next, a second front-side metallization material is deposited on the front-side metallization plugs 418.

Referring again to FIG. 5, in block 508, a handle substrate is bonded to the front-side dielectric layer. For example, as shown in FIG. 4, the handle substrate 402 is bonded to the front-side dielectric layer 404. In block 510, the sacrificial substrate is removed. As shown in FIG. 3B, the layer-transfer process includes removal of the sacrificial substrate 301. In block 512, backside silicidation is performed to deposit a backside contact layer comprising silicide on a first side of a semiconductor layer of the device. For example, as shown in FIG. 4, the backside contact layer 432 is deposited on semiconductor layer 412.

In block 514, a backside metallization is fabricated on the isolation layer. As shown in FIG. 4, the passive device 410 is fabricated on the first surface of the isolation layer 420, and the backside metallization 414 is fabricated on an opposing surface of the isolation layer 420 distal from the handle substrate 402. In addition, the backside metallization 414 may be coupled to the semiconductor layer 412 through the backside contact layer 432. During fabrication of the backside metallization 414, the isolation layer 420 is patterned and etched to expose predetermined portions of the backside contact layer 432. Once exposed, a first backside metallization material is deposited on the exposed, predetermined portions of the backside contact layer 432 to form the backside metallization plugs 424 (e.g., backside tungsten plugs). Next, a second backside metallization material is deposited on the backside metallization plugs 424. The backside metallization 414 can be arranged distal and directly opposite to the front-side metallization 406.

According to a further aspect of the present disclosure, integrated RF circuitry structures, including a dual side contacted capacitor, are described. The integrated RF circuit structure includes means for storing charge. The integrated RF circuit structure also includes an isolation layer and a backside dielectric layer. The charge storing means may be the semiconductor layer 412 and gate layer 408, shown in FIG. 4. In another aspect, the aforementioned means may be any module or any apparatus configured to perform the functions recited by the aforementioned means.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material. Metal oxide semiconductor capacitors (MOS) capacitors are one example of a parallel plate capacitor, in which the insulator is a gate oxide, and the plates are made of a body and a gate of a device.

MOS capacitors may be used in RF applications to provide an increased capacitance density. Unfortunately, MOS capacitors used in advanced complementary MOS (CMOS) processing may occupy a large area. Moreover, the thinning of the body in SOI devices yields a substantial body resistance that has become a limiting factor in MOS capacitor performance. As a result, instead of one large area capacitor, many small area capacitors are used to provide a desired capacitance density. This results in inefficient use of chip space, increased chip complexity, and lower chip performance.

Aspects of the present disclosure describe using a post layer-transfer metallization to form a dual side contacted capacitor (e.g., a MOS capacitor). The post transfer metallization process may form a backside metallization coupled to a first plate of the capacitor. In addition, a front-side metallization distal from the backside metallization may be coupled to a second plate of the capacitor. In this arrangement, the dual side contacted capacitor may provide a desired capacitance density by using a single capacitor without having to perform conventional capacitor subdivision to achieve a desired capacitance density.

In this arrangement, a front-side metallization is coupled to a second plate of a capacitor and arranged distal from a backside metallization that is coupled to a first plate of the capacitor. In aspects of the present disclosure, the first plate is composed of a silicon on insulator (SOI) layer, and the second plate is composed of a gate layer. The backside metallization is coupled to the first plate of the capacitor through a backside contact layer. The front-side metallization is coupled to the second plate through a front-side contact layer. In this arrangement, the capacitor provides a desired capacitance density by using a single capacitor without having to perform conventional capacitor subdivision, which results in additional chip space, decreased chip complexity, and increased chip efficiency and performance.

Figure 6:
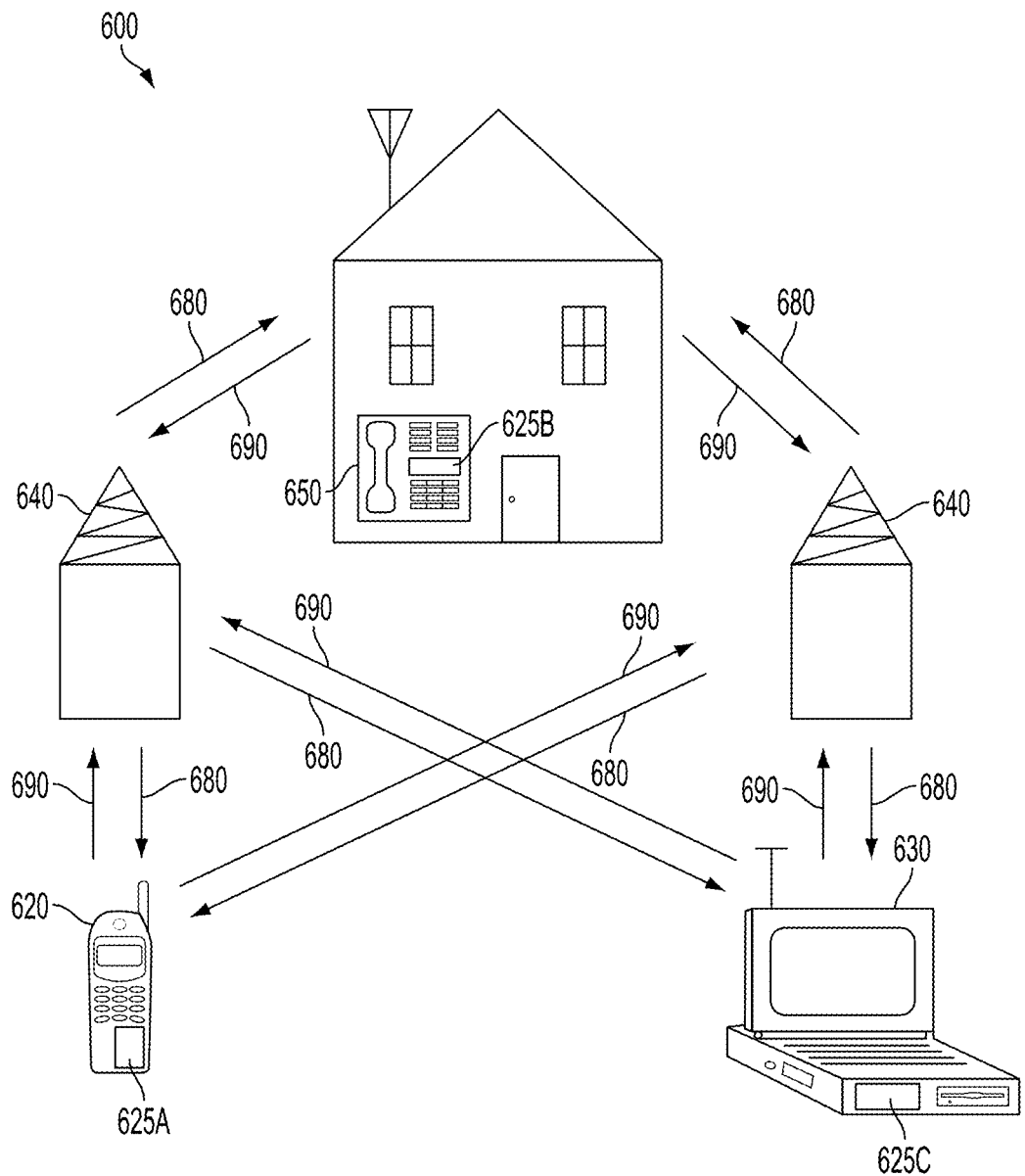
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed dual side contacted capacitor. It will be recognized that other devices may also include the disclosed, dual side contacted capacitor, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed dual side contacted capacitor.

Figure 7:
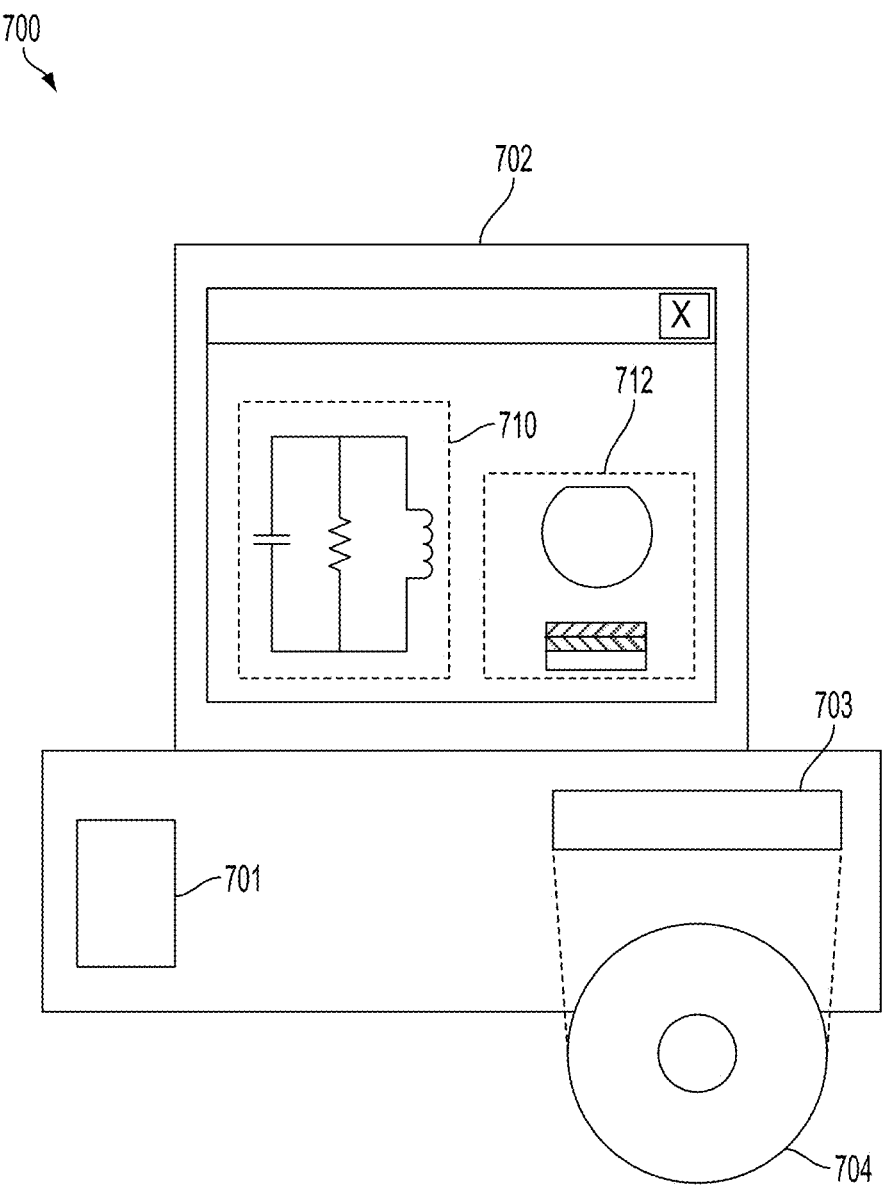
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the dual side contacted capacitor disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a dual side contacted capacitor. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of constructing an integrated circuit structure, comprising:
   fabricating a capacitive device supported by an isolation layer and disposed on a sacrificial substrate by forming a diffusion region in a semiconductor layer on the isolation layer, depositing a device dielectric layer on the diffusion region, and depositing a gate layer on the diffusion region to form the capacitive device;

depositing a front-side contact layer on the gate layer of the capacitive device;

fabricating a front-side metallization in a front-side dielectric layer on the gate layer of the capacitive device and coupled to the front-side contact layer;

bonding a handle substrate to the front-side dielectric layer on the capacitive device;

removing the sacrificial substrate;

depositing a backside contact layer on the semiconductor layer of the capacitive device; and fabricating a backside metallization in a backside dielectric layer supporting the isolation layer, the backside metallization coupled to the semiconductor layer through the backside contact layer and arranged distal from the front-side metallization.

2. The method of claim 1, in which fabricating the backside metallization comprises:

patterning the isolation layer according to the semiconductor layer of the capacitive device to expose predetermined portions of the backside contact layer;

depositing a backside metallization material within the patterned, isolation layer and on the exposed, predetermined portions of the backside contact layer to form the backside metallization; and depositing the backside dielectric layer on the isolation layer and the backside metallization.

3. The method of claim 2, in which depositing the backside metallization material comprises:

depositing a first backside metallization material on the exposed, predetermined portions of the backside contact layer to form a plurality of backside metallization plugs; and depositing a second backside metallization material on the plurality of backside metallization plugs.

4. The method of claim 1, in which fabricating the front-side metallization comprises:

patterning the front-side dielectric layer according to the gate layer of the capacitive device to expose predetermined portions of the backside contact layer;

depositing a first backside metallization material within the patterned, front-side dielectric layer and on the exposed, predetermined portions of the backside contact layer to form a plurality of front-side metallization plugs; and depositing a second front-side metallization material on the plurality of front-side metallization plugs to form the backside metallization.

5. The method of claim 1, in which bonding the handle substrate further comprises:

depositing a trap rich layer on the front-side dielectric layer; and bonding the handle substrate to the trap rich layer.

6. The method of claim 1, further comprising integrating the RF integrated circuit structure into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *